(12) United States Patent
Wong et al.

(10) Patent No.: US 8,448,033 B2
(45) Date of Patent: May 21, 2013

(54) INTERLEAVING/DE-INTERLEAVING METHOD, SOFT-IN/SOFT-OUT DECODING METHOD AND ERROR CORRECTION CODE ENCODER AND DECODER UTILIZING THE SAME

(75) Inventors: Cheng-Chi Wong, Banqiao (TW); Hsi-Chia Chang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 302 days.

(21) Appl. No.: 12/955,709

(22) Filed: Nov. 29, 2010

(65) Prior Publication Data

US 2011/0173507 A1  Jul. 14, 2011

Related U.S. Application Data

(60) Provisional application No. 61/294,862, filed on Jan. 14, 2010.

(51) Int. Cl.
*G06F 11/00* (2006.01)

(52) U.S. Cl.
USPC ............................ 714/746; 714/704; 714/794

(58) Field of Classification Search
USPC ................... 714/746, 790, 794, 755, 704
See application file for complete search history.

(56) References Cited

U.S. PATENT DOCUMENTS

| | | | |
|---|---|---|---|
| 6,629,287 B1 * | 9/2003 | Brink | 714/755 |
| 6,775,800 B2 | 8/2004 | Edmonston et al. | |
| 7,372,802 B2 * | 5/2008 | Breiling et al. | 370/206 |
| 8,335,949 B2 * | 12/2012 | Chugg et al. | 714/704 |
| 2008/0133997 A1 | 6/2008 | Lee et al. | |

OTHER PUBLICATIONS

Yoon, S., et al; "A Parallel MAP Algorithm for low latency Turbo Decoding;" Communications Letters, IEEE ; vol. 6; Issue 7; Digital Object Identifier; 10.1109/LCOMM.2002.801310; Jul. 2002; pp. 288-290.

Masera, G., et al.; "Architectural Strategies for Low-Power VLSI Turbo Decoders;" IEEE Transactions on Very Large Scale Integration (VLSI) Systems; vol. 10; Issue 3; Digital Object Identifier; 10.1109/TVLSI.2002.1043330; Jun. 2002; pp. 279-285.

Zhang, J., et al.; "Shuffled Iterative Decoding;" Communications, IEEE Transactions on Communications; vol. 53; Issue 2; Digital Object Identifier: 10.1109/TCOMM2004.841982; Feb. 2005; pp. 209-213.

Takeshita, O.Y.; "On Maximum Contention-Free Interleavers and Permutation Polynomials Over Integer Rings;" IEEE Transactions on Information Theory; vol. 52; Issue 3; Digital Object Identifier: 10.1109/TIT.2005.864450; Mar. 2006; pp. 1249-1253.

(Continued)

*Primary Examiner* — Fritz Alphonse
(74) *Attorney, Agent, or Firm* — McClure, Qualey & Rodack, LLP (57) ABSTRACT

An error correction code encoder is provided. A first encoder encodes input information bits and generates first parity check bits. An interleaver interleaves the input information bits and generates permuted information bits. A second encoder encodes the permuted information bits and generates second parity check bits. The interleaver interleaves the input information bits in a window-wise manner so that the input information bits are divided into input information bit windows before being interleaved, and permuted information bit windows having the permuted information bits are generated thereafter. When the input information bit windows are grouped into groups according to different window index characteristics, the window index of each permuted information bit window has the same characteristic as the corresponding input information bit window interleaved therefrom.

10 Claims, 7 Drawing Sheets

OTHER PUBLICATIONS

Nimbalker, A., et al; "Inter-Window Shuffle Interleavers for High Throughput Turbo Decoding;" 3rd Int. Symp. on Turbo Codes and Rel. Topics, Brest; Sep. 2003; pp. 355-358.

Gnaedig, D., et al; "Inter-Window Shuffle Interleavers for High Throughput Turbo Decoding;" TURBO-CODING-2006, 4th International Symposium on Turbo Codes & Related Topics, 6th International ITG-Conference on Source and Channel Coding, Apr. 3-7, 2006, Munich; pp. 1-6.

* cited by examiner

INTERLEAVING/DE-INTERLEAVING METHOD, SOFT-IN/SOFT-OUT DECODING METHOD AND ERROR CORRECTION CODE ENCODER AND DECODER UTILIZING THE SAME

CROSS REFERENCE TO RELATED APPLICATIONS

This application claims the benefit of U.S. Provisional Application No. 61/294,862 filed 2010 Jan. 14 and entitled "A High-Efficiency QPP Interleaving Method and Decoding Schedule". The entire contents of which are hereby incorporated by reference.

BACKGROUND OF THE INVENTION

1. Field of the Invention

The invention relates to an interleaving/de-interleaving and corresponding error correcting coding/decoding methods, and more particularly to a highly efficient interleaving/de-interleaving method for high turbo coding/decoding performance.

2. Description of the Related Art

Turbo code, also known as the parallel concatenated convolutional code, is impressive with the near Shannon limit performance A rate-⅓ turbo codeword is formed by the systematic data along with two parity checks, which are encoded from the information in original order and in permuted order, respectively. A conventional turbo decoder consists primarily of one soft-in/soft-out (SISO) decoder for calculating soft value, wherein codewords received and temporary results are stored in a memory. For each component code, the SISO decoder can utilize a maximum a posteriori probability (MAP) algorithm to obtain a log-likelihood ration (LLR) and extrinsic information. The LLR is used to make decisions, and the extrinsic information is treated as the a priori estimation for the other component code. The soft value computation of each component code is called, one half-iteration, and two successive half-iterations constitute of a complete iteration. The decoding flow alternates between an original component and a permuted component until certain stopping criterion is satisfied.

However, some characteristics of turbo codes combine to make the associated decoders more difficult to implement in an integrated circuit. These characteristics include large frame sizes, the use of repeated decoding steps that incorporate extrinsic information, and the use of a pseudo random interleaver for generating interleaved versions of the transmitted information and extrinsic information used during encoding and decoding. Additionally, many turbo-coding schemes require a sufficiently high degree of randomness in the psuedo random interleaver such that the sequence must be stored in memory rather than calculated on the fly. This combination of characteristics causes turbo codes to require, in general, greater processing resources than other forward error correction coding techniques. For example, the use of repeated decoding steps increases the decoding time.

Figure 1:
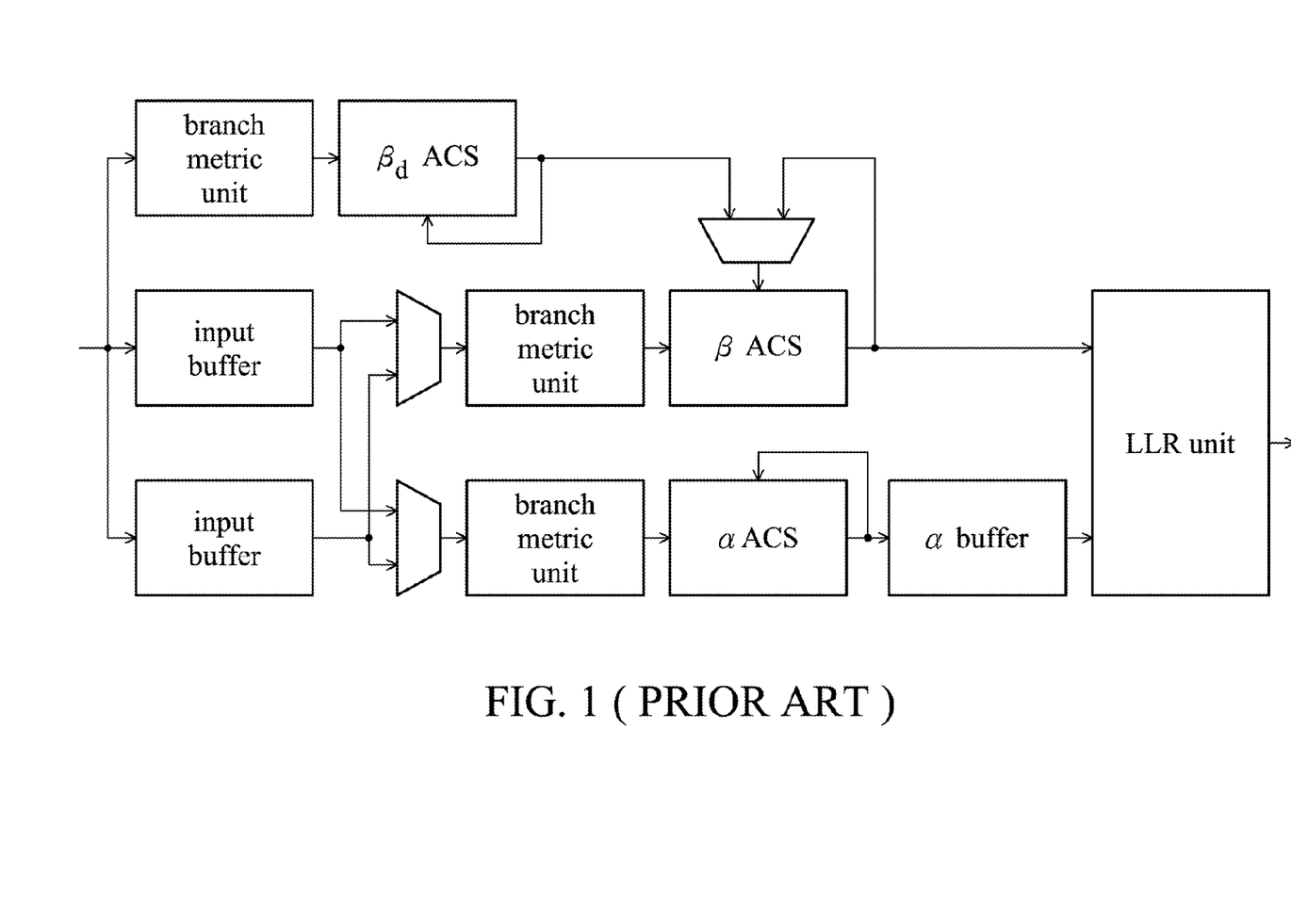
FIG. 1 is a schematic diagram showing a conventional decoding process of a turbo code SISO decoder.
Figure 2:
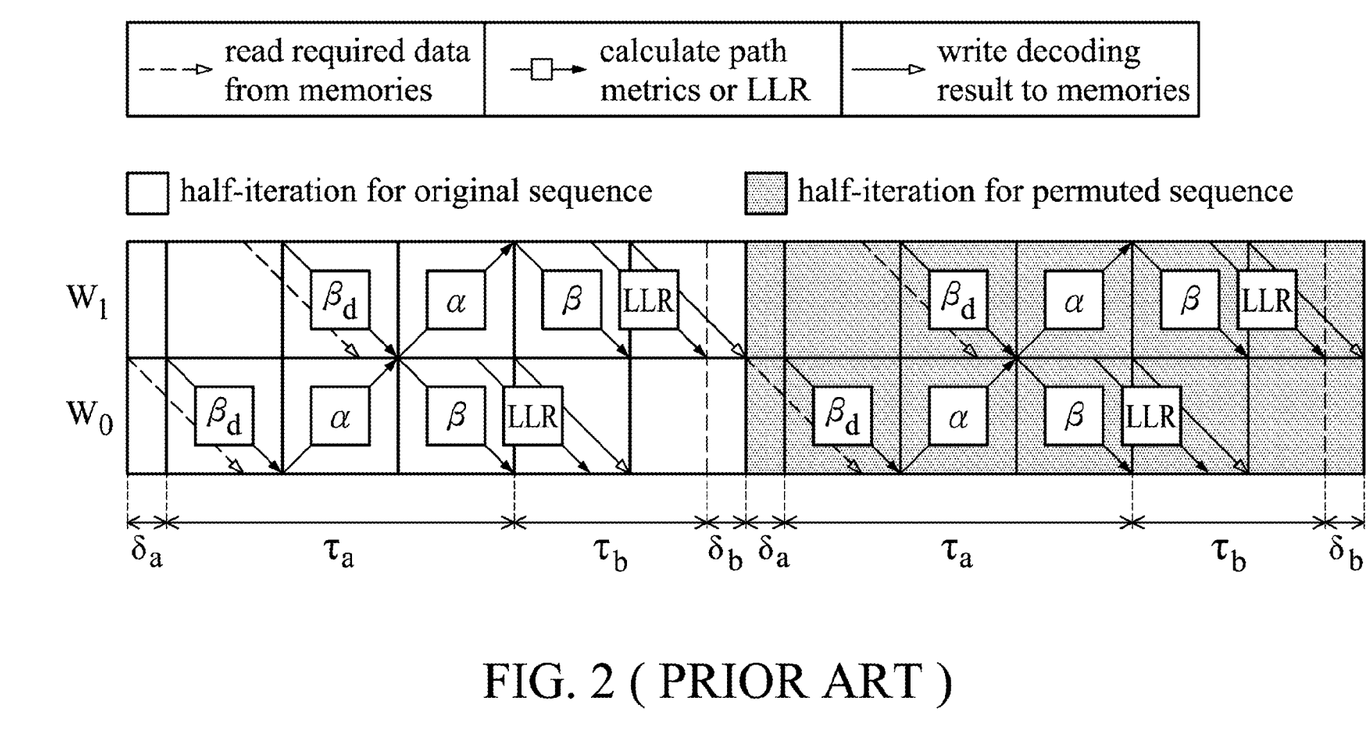
FIG. 2 is a schematic diagram showing the decoding flow of the conventional SISO decoder.

FIG. 1 is a schematic diagram showing a conventional decoding process of a turbo code SISO decoder. The SISO decoder includes a plurality of buffers, such as the input buffers and α buffer as shown, for temporarily storing the input codewords to be decoded and the calculation results of the forward path metric α. The SISO decoder further includes a plurality of calculation units, such as the branch metric units for calculating the branch metrics, β ACS for calculating the backward path metric β, and $\beta_d$ ACS for calculating the dummy backward path metric $\beta_d$. The LLR unit generates the log-likelihood ration (LLR) calculation result for calculating the soft value based on the forward and backward path metrics α and β. FIG. 2 is a schematic diagram showing the decoding flow of the conventional SISO decoder for obtaining the branch metrics and path metrics, wherein the blocks filled with gray color represent calculations of a half iteration for permuted sequences. As previously described, the decoding flow alternates between the original component and the permuted component until certain stopping criterion is satisfied. The conventional SISO decoder usually adopts the sliding window method to calculate the path metric and LLR for less overhead. The time required in each half-iteration can be defined as follows: $\delta_a$ is the pipeline delay, $\delta_b$ is the memory access time, $\tau_a$ is the time to get the necessary metrics for LLR in the first window $W_0$, and $\tau_b$ is the time to derive the LLR results and decisions of all windows. Since it takes $\tau_b$ out of the total execution time to generate outputs, the operating efficiency η can be derived by:

$$\eta = \frac{\tau_b}{\tau_a + \tau_b + \delta_a + \delta_b} \quad \text{Eq. (1)}$$

where the value of $\tau_a$, $\tau_b$, $\delta_a$, and $\delta_b$ are affected by window length and decoder architecture. For the decoding schedule of a conventional SISO decoder shown in FIG. 1, the execution periods for two windows can be expressed as:

$$\begin{cases} 0 \leq \delta_a, \delta_b \leq L \\ 2L \leq \tau_a \leq 3L \\ \tau_b = 2L \end{cases} \quad \text{Eq. (2)}$$

For simplicity, it is assumed that the SISO decoder can process one trellis stage per cycle. In addition, the window length is represented as L here. When the window number is K (=N/L, N is the total bit number), only $\tau_b$ grows to K×L cycles, and the other terms remain unchanged. Here we assume the summation of $\delta_a$, $\delta_b$ and $\tau_a$ is approximated to 3 L cycles, and then η will be $$\frac{K}{K+3}.$$

It is obvious that a smaller K results in lower operating efficiency η. Further, because corresponding extrinsic information is not available until completion of a previous half iteration, the conventional SISO decoder has to wait for completion of a current half iteration and then start a new half iteration. In other words, a new half iteration cannot be started while a current half iteration is still in process. Otherwise, undesired idle time of the calculation units would occur.

Figure 3:
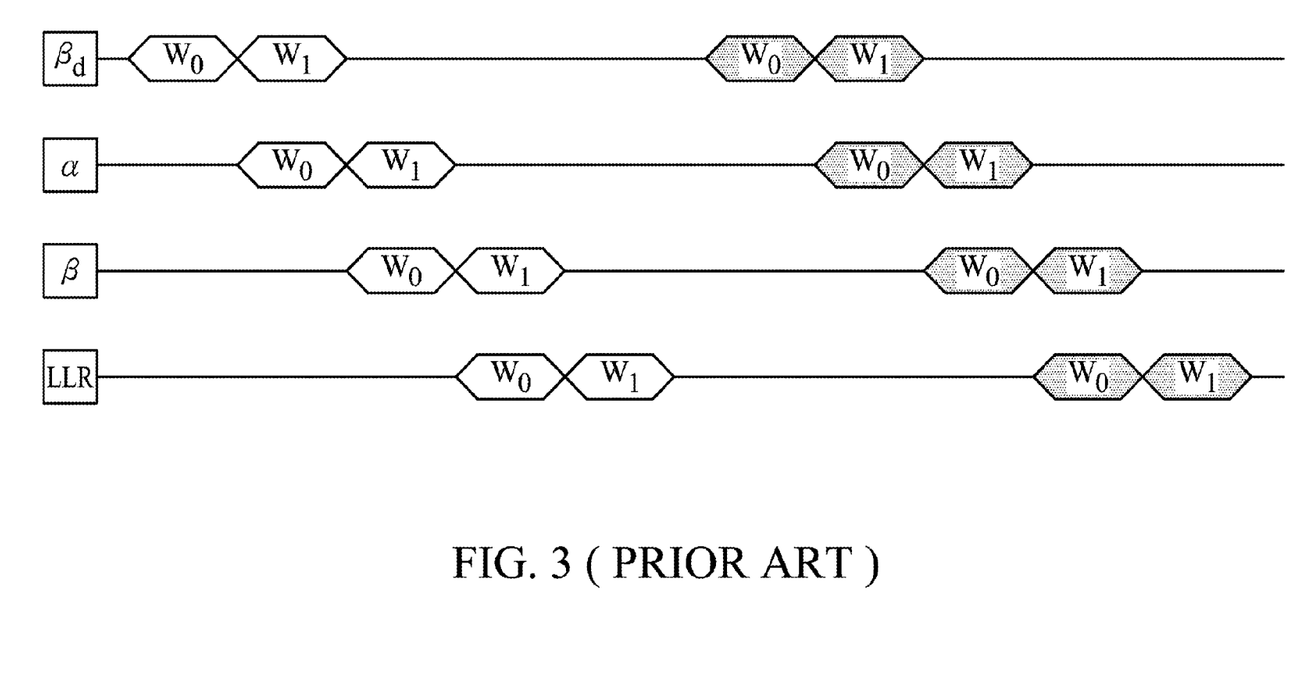
FIG. 3 is a timing diagram showing the active periods of the calculating units in the conventional SISO decoder shown in FIG. 1.

FIG. 3 is a timing diagram showing the active periods of the calculating units in the conventional SISO decoder as shown in FIG. 1, where the $W_i$ stands for the i-th window, and in each window, the dummy backward path metric $\beta_d$, forward path metric α, backward path metric β and LLR are computed successively. As shown in FIG. 3, the idle periods of the calculating units in the conventional SISO decoder are actually longer than the active periods, causing low decoding efficiency.

To solve the above-mentioned low efficiency problems, a novel turbo SISO decoding method in company with corresponding interleaving/de-interleaving techniques to provide higher decoding performance and greater efficiency is highly required.

BRIEF SUMMARY OF THE INVENTION

Error correction code encoders, error correction code decoders, interleaving/de-interleaving methods performed by an interleaver/de-interleaver associated with a turbo code encoder and soft-in/soft-out (SISO) decoding methods performed by an SISO decoder in a turbo code decoder are provided. An embodiment of an error correction code encoder comprises a first encoder, an interleaver and a second encoder. The first encoder is arranged to encode a plurality of input information bits to generate a plurality of first parity check bits. The interleaver is arranged to interleave the plurality of input information bits to generate a plurality of permuted information bits. The second encoder is arranged to encode the plurality of permuted information bits to generate a plurality of second parity check bits. The interleaver interleaves the plurality of input information bits in a window-wise manner so that the plurality of input information bits are divided into a plurality of input information bit windows before being interleaved, and a plurality of permuted information bit windows comprising the plurality of permuted information bits are generated thereafter. When the plurality of input information bit windows are grouped into a plurality of groups according to different window index characteristics, the window index of each permuted information bit window generated by the interleaver has the same characteristic as the corresponding input information bit window interleaved therefrom.

Another embodiment of an error correction code decoder comprises a first soft-in/soft-out (SISO) decoder, an interleaver/de-interleaver and a second SISO decoder. The first SISO decoder is arranged to receive a plurality of metrics associated with a turbo coded signal and perform SISO decoding on the plurality of metrics to generate first extrinsic information. The interleaver/de-interleaver is arranged to interleave the first extrinsic information to generate first prior probability information. The second SISO decoder is arranged to perform SISO decoding on the first prior probability information to generate second extrinsic information. The first SISO decoder further generates first log-likelihood ration (LLR) information as a first decoding result according to the plurality of metrics associated with the turbo coded signal and the second extrinsic information, and the second SISO decoder further generates second LLR information as a second decoding result according to the plurality of metrics and the first prior probability information. The first and second SISO decoder start calculation of a new half-iteration of SISO decoding before completion of calculation of a current half-iteration so that calculations of successive half-iterations are simultaneously performed.

Another embodiment of an interleaving/de-interleaving method performed by an interleaver/de-interleaver associated with a turbo code encoder comprises: interleaving a plurality of input information bits to generating a plurality of permuted information bits, wherein the plurality of input information bits are interleaved in a window-wise manner so that the plurality of input information bits are divided into a plurality of input information bit windows before being interleaved, and a plurality of permuted information bit windows comprising the plurality of permuted information bits are generated after the interleaving step, and wherein when the plurality of input information bit windows are grouped into at least two groups according to different window index characteristics, the window index of each permuted information bit window has the same characteristics as the corresponding input information bit window interleaved therefrom.

Another embodiment of a soft-in/soft-out (SISO) decoding method performed by an SISO decoder in a turbo code decoder, comprises: receiving a plurality of metrics associated with a turbo coded signal; and performing a SISO decoding process on the plurality of metrics to generate probability information, wherein the SISO decoding process comprises two half-iterations constituting a complete iteration for generating the probability information, and in the step of performing the SISO decoding process, a new half-iteration is started before completion of performing a current half-iteration so that successive half-iterations are concurrently processed.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Referring back to FIG. 1 to FIG. 3, for a conventional SISO decoder, it is difficult to eliminate the necessary execution time for path metric calculation and memory access by scheduling each individual half-iteration. The LLR units remain idle during the interval between the last decision in one half-iteration and the first decision in the succeeding half-iteration. If the new half-iteration starts before the completion of current half-iteration, that is, two successive half-iterations are concurrently performed, then fewer inactive cycles and higher operating efficiency $\eta$ will be achieved. However, because after being interleaved by the interleaver, the last data in the original sequence may be mapped to the initial locations in permuted sequences, such a concurrently performed schedule of two successive half-iterations poses two problems. First, the SISO decoder requests the a priori estimation for the new half-iteration while the corresponding extrinsic information is not available. Thus, in this case, the SISO decoder would access unreliable extrinsic information from older half-iterations, and it might cause a catastrophic performance loss. Second, because of the design, during memory access, complications may occur. The output of unfinished half-iterations is written back to the memory, and the input of new half-iterations is read from the memory simultaneously. While the read and write operations access the same address, some memories may output unknown signals.

To solve the above-mentioned problems, a novel turbo code decoding method and apparatus, and the corresponding interleaving/de-interleaving method utilized by an interleaver/de-interleaver of a turbo code encoder are proposed.

Figure 4:
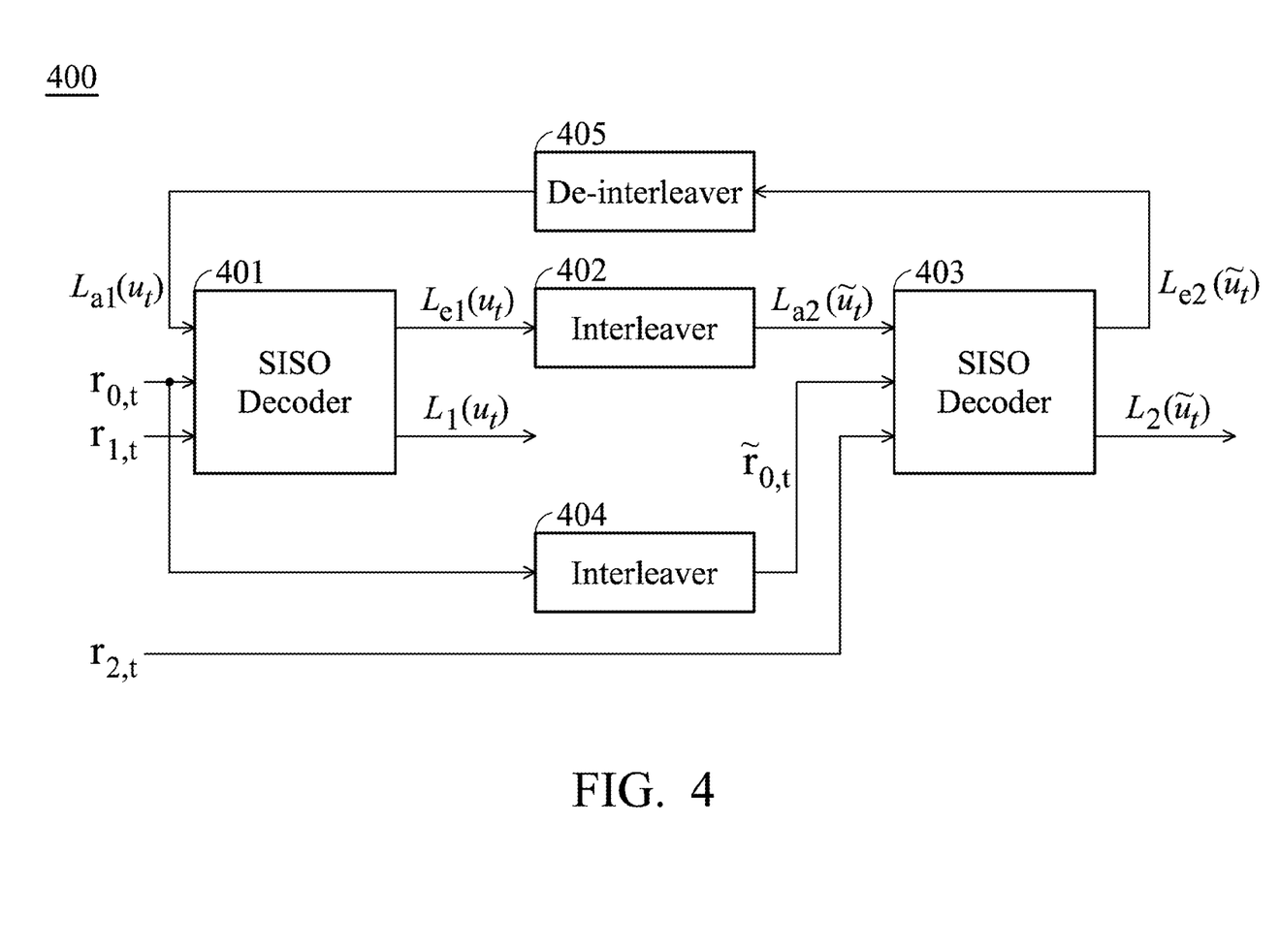
FIG. 4 is a schematic diagram showing a turbo code decoder according to an embodiment of the invention.

FIG. 4 is a schematic diagram showing a turbo code decoder according to an embodiment of the invention. The turbo code decoder 400 comprises a first soft-in/soft-out (SISO) decoder 401, a first interleaver 402, a second SISO decoder 403, a second interleaver 404 and a de-interleaver 405. The first SISO decoder 401 receives a plurality of metrics $r_{0,t}$, $r_{1,t}$ and $r_{2,t}$, which are associated with a turbo coded signal, and performs SISO decoding on the plurality of metrics $r_{0,t}$, $r_{1,t}$ and $r_{2,t}$ to generate extrinsic information $L_{e1}(u_t)$. The first interleaver 402 interleaves the extrinsic information $L_{e1}(u_t)$ to generate prior probability information $L_{a2}(ũ_t)$. The second SISO decoder 402 performs SISO decoding on the received prior probability information $L_{a2}(ũ_t)$ to generate extrinsic information $L_{e2}(ũ_t)$. The second interleaver 404 interleaves the metric of system information $r_{0,t}$ and generated permuted system information $ř_{0,t}$. The de-interleaver 405 de-interleaves the extrinsic information $L_{e2}(ũ_t)$ and generates the prior probability information $L_{a1}(u_t)$. As shown in FIG. 4, the first SISO decoder 401 further generates first log-likelihood ration (LLR) information $L_1(u_t)$ as a first decoding result according to the plurality of metrics $r_{0,t}$ and $r_{1,t}$ associated with the turbo coded signal and the extrinsic information $L_{a1}(u_t)$. The second SISO decoder 403 further generates second LLR information $L_2(ũ_t)$ as a second decoding result according to the metrics $ř_{0,t}$ and $r_{2,t}$ and the prior probability information $L_{a2}(ũ_t)$.

According to the embodiments of the invention, in order to increase the operating efficiency, the SISO decoders start calculation of a new half-iteration of SISO decoding before completion of calculations of a current half-iteration. To be more specific, different from the conventional SISO decoding process, in the embodiments of the invention, calculations of successive half-iterations are simultaneously performed, where the period in which two successive half-iterations are simultaneously performed is called an "overlapping region" in the specification. Note that due to the constraints of the conventional turbo code encoding and decoding scheme, it is difficult to eliminate the necessary execution time for path metric calculation and memory access by scheduling each individual half-iteration. As shown in FIG. 3, the LLR units of the SISO decoder remain idle between the last decision in one half-iteration and the first decision in the succeeding half-iteration. Because the last data in an original sequence might be mapped onto the initial locations in a permuted sequence, for a conventional SISO decoder, several problems would be posed if a new half-iteration is attempted to be started before the completion of the current half-iteration. First, the SISO decoder would request the a priori estimation for the new half-iteration while the corresponding extrinsic information is not available. Thus, the SISO decoder would access unreliable extrinsic information from older half-iterations, which might cause a catastrophic performance loss. Second, because of the design, during memory access, complications may occur. The output of unfinished half-iterations is written back to the memory, and the input of new half-iterations is read from the memory simultaneously. While the read and write operations access the same address, some memories will output unknown signals.

In order to solve the above-mentioned problems while still achieving high operating efficiency of the SISO decoder, a novel interleaving/de-interleaving method performed by an interleaver/de-interleaver associated with a turbo code encoder is proposed. According to the spirit of the invention, the interleaver must guarantee that there is no correlation between the last data of one half-iteration and the initial data of the following half-iteration for SISO decoding.

Figure 5:
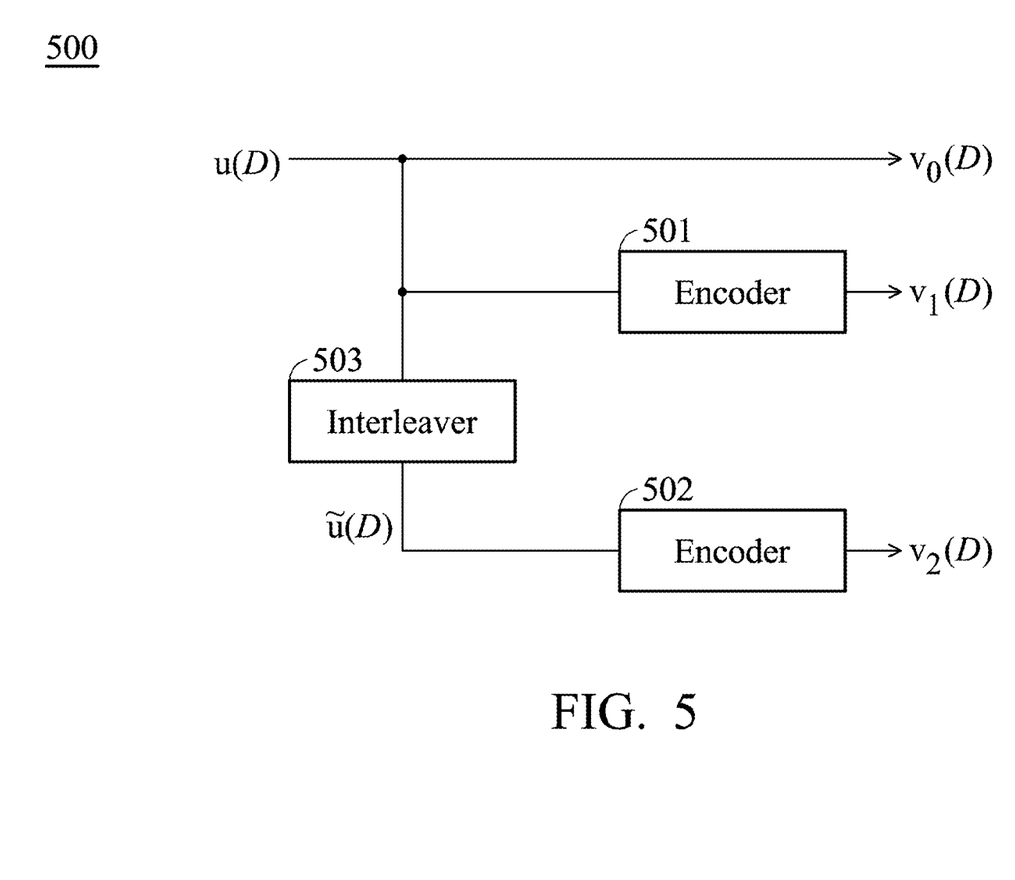
FIG. 5 is a schematic diagram showing a turbo code encoder according to an embodiment of the invention.

FIG. 5 is a schematic diagram showing a turbo code encoder according to an embodiment of the invention. The turbo code encoder 500 comprises a first encoder 501 encoding input information bits u(D) to generate first parity check bits $v_1(D)$, an interleaver 502 interleaving the input information bits u(D) to generate permuted information bits ũ(D), and a second encoder 502 encoding the permuted information bits ũ(D) to generate second parity check bits $v_2(D)$. According to the embodiments of the invention, the interleaver 503 interleaves the input information bits u(D) in a window-wise manner so that the input information bits u(D) are divided into a plurality of input information bit windows before being interleaved, to generate a plurality of permuted information bit windows comprising the permuted information bits. In the embodiments of the invention, all windows in the original sequence (that is, the input information bit windows before being interleaved) may be regarded as being categorized into a plurality of groups, so do all windows in the permuted sequence. The objective of the proposed interleaver 503 is to let one group of original-ordered windows be exactly mapped onto one group of permuted-order windows. Then the decoder may arrange the execution order of windows and prevent the complications caused by simultaneously processing successive half-iterations.

According to the embodiments of the invention, when the plurality of input information bit windows are categorized into a plurality of groups according to different window index characteristics, the window index of each permuted information bit window generated by the interleaver 503 may have the same or similar characteristic as the corresponding input information bit window interleaved therefrom. For example, when the plurality of input information bit windows are categorized into two groups based on whether the window index is an even or odd number, the window index of each permuted information bit window is an even/odd number when the window index of the corresponding input information bit window interleaved therefrom is an even/odd number. Note that the interleaver 503 may also be designed to make the window index of each permuted information bit window to be an even/odd number when the window index of the corresponding input information bit window interleaved therefrom is an odd/even number, and the invention should not be limited thereto. Similar concepts may also be applied when the plurality of input information bit windows are categorized into more than two groups. For example, when the plurality of input information bit windows are categorized into m groups based on their window indexes i, the interleaver 503 may also be designed to make the window index of each permuted information bit window to be a specific number n equal to the result after taking i modulo m when the result of taking the window index of the corresponding input information bit window interleaved therefrom modulo m is also n (or n plus a fixed number), and the invention should not be limited thereto.

According to the embodiments of the invention, the interleaver 503 may be a commonly used interleaver, such as a quadratic permutation polynomial (QPP) interleaver, an almost regular permutation (ARP) interleaver, or others. Take the QPP interleaver as an example, the QPP interleaver is adopted by 3GPP LTE standard for its simple formula and outstanding performance. In addition, this interleaver has a contention-free property so that it can support parallel processing. For a size-N block, the QPP interleaver is expressed as:

$$F(x) = f_1 x + f_2 x^2 (\bmod N) \quad \text{Eq. (3)}$$

where x stands for the original address, the F(x) stands for the interleaved address and mod stands for the modulo operation. By imposing some constraints on the QPP interleaver, the QPP interleaver can match the above requirements. First of all, a proper address expression is necessary in the window-wise strategy. The x in Eq. (3) is replaced with (sL+j), indicating the j-th data in the s-th window, where L is window length. After the substitution, the interleaving address is rewritten as the index $q_j$ in the $Q_s$-th window as:

$$F(sL+j) = f_1 s L + f_2 s^2 L^2 + 2 f_2 j s L + f_1 j + f_2 j^2 \quad \text{Eq. (4)}$$
$$= Q_s L + q_j (\bmod N)$$

Note that $0 \leq s$, $$Q_s < \frac{N}{L},$$

and $0 \leq j$, $q_j < L$. The $Q_s$ is determined by s and j, whereas $q_j$ depends on j only. We can divide both sides of Eq. (4) by L and get $Q_s$ as:

$$Q_s = f_1 s + f_2 s^2 L + 2 f_2 j s + \left\lfloor \frac{f_1 j + f_2 j^2}{L} \right\rfloor \left(\bmod \frac{N}{L}\right) \quad \text{Eq. (5)}$$

The interleaver design involves classification methods and mapping rules, and only s and $Q_s$ are under consideration. For simplicity, four basic restrictions are set, including: $2 \nmid f_1$, $2 | f_2$, $L | N$, and $2 | L$, where a|b means b is divisible by a. In one embodiment of the invention, all windows are categorized according to s and $Q_s$ modulo 2, then the interleaver 503 lets all even s's and all odd s's map onto all even $Q_s$'s all odd $Q_s$'s, respectively. Thereby, window index $Q_s$ of each permuted information bit window generated by the interleaver 503 may have the same characteristic as the window index s of the corresponding input information bit window interleaved therefrom. The following proposition is used for deriving the above property.

Proposition 1: Let $2 \nmid f_1$, $2 | f_2$, $L | N$, and $2 | L$. If the $f_1$, $f_2$, and L can satisfy the following constraints in Eq. (6a), Eq. (6b) and Eq. (6c), then $Q_s$ and s can be congruent modulo 2.

$$L | (f_1 - 1) \quad \text{Eq. (6a)}$$

$$L | f_2 \quad \text{Eq. (6b)}$$

$$(f_1 - 1)/L \equiv f_2 / L (\bmod 2) \quad \text{Eq. (6c)}$$

Proof Because $2 \nmid f_1$ and $2 | f_2$, it is trivial that $f_{1s} \equiv s \pmod{2}$, $f_{s^2} L \equiv 0 \pmod 2$, and $2 f_{2js} \equiv 0 \pmod 2$. The congruent relations can simplify $Q_s \pmod 2$ to the following equation:

$$Q_s \equiv f_1 s + f_2 s^2 L + 2 f_2 j s + \left\lfloor \frac{f_1 j + f_2 j^2}{L} \right\rfloor (\bmod 2) \quad \text{Eq. (7)}$$
$$\equiv s + \left\lfloor \frac{f_1 j + f_2 j^2}{L} \right\rfloor (\bmod 2)$$

The last term in Eq. (7) can be rewritten as:

$$\left\lfloor \frac{f_1 j + f_2 j^2}{L} \right\rfloor = \left\lfloor \frac{(f_1 - 1) j}{L} + \frac{f_2 j^2}{L} + \frac{j}{L} \right\rfloor \quad \text{Eq. (8)}$$

For Eq. (6a) and Eq. (6b), both $$\frac{(f_1 - 1) j}{L} \text{ and } \frac{f_2 j^2}{L}$$

are integers. The constraint in Eq. (6c) promises that the summation of the two terms is an even number. Also, the term j/L is eliminated through the floor function because j<L. As a result, the last term in Eq. (7) is divisible by 2 and can be removed, and $Q_s \equiv s \pmod 2$ holds true for $$s = 0 \sim \left(\frac{N}{L} - 1\right)$$

and j=0~(L−1).

As previously described, different from the conventional SISO decoding process, in the embodiments of the invention, calculations of successive half-iterations are simultaneously performed, where the period in which two successive half-iterations are simultaneously performed is called an "overlapping region" in the specification. According to an embodiment of the invention, the maximal length of an overlapping region may be $(\delta_a + \delta_b + \tau_a)$, which is the period between the last LLR calculation in a current half-iteration and the first LLR circulation in a next half-iteration. Note that the actual overlapping region is dominated by the number and order of processed windows. These two factors may be influenced when the data in the subsequent half-iteration can access reliable extrinsic information. According to the restricted mapping relationship between s and $Q_s$, the processed windows within the overlapping region should satisfy the constraint $s \neq Q_s \pmod 2$. Moreover, for the SISO decoder to arrange the execution order of windows, different groups of windows may be executed one after one. For example, when categorizing the input information bit windows into two groups (e.g. even and odd), the SISO decoder may complete the executions for either all even-indexed windows or all odd-indexed windows before the overlapping region. Take the decoding schedule of two windows for example, as the data of $W_0$ in original sequence is mapped to $W_0$ in a permuted sequence only, the executions of the permuted-ordered $W_0$ can start L cycles in advance; then the LLR of original-ordered $W_1$ and the α of permuted-ordered $W_0$ are computed simultaneously. Its equivalent operating efficiency η increases from 50% of the conventional SISO decoding schedule to 66.7%.

Figure 6:
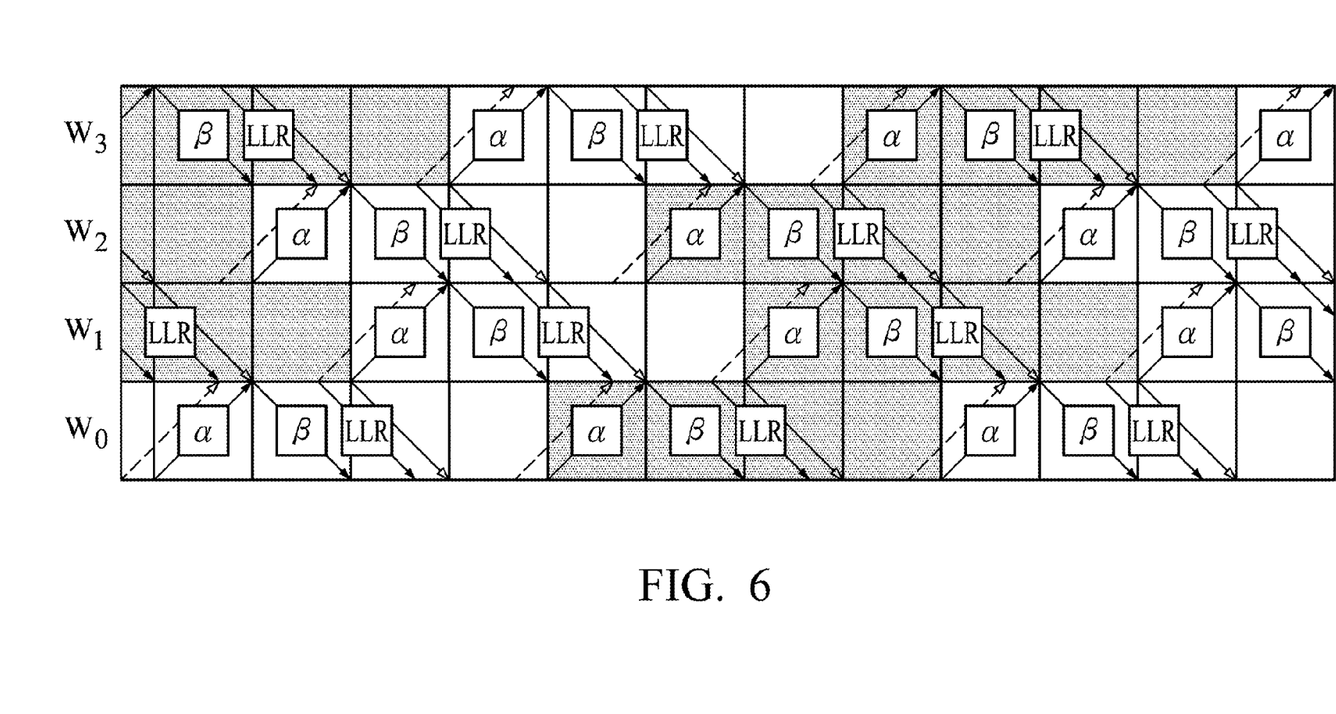
FIG. 6 is a schematic diagram showing the decoding flow of the proposed SISO decoder.
Figure 7:
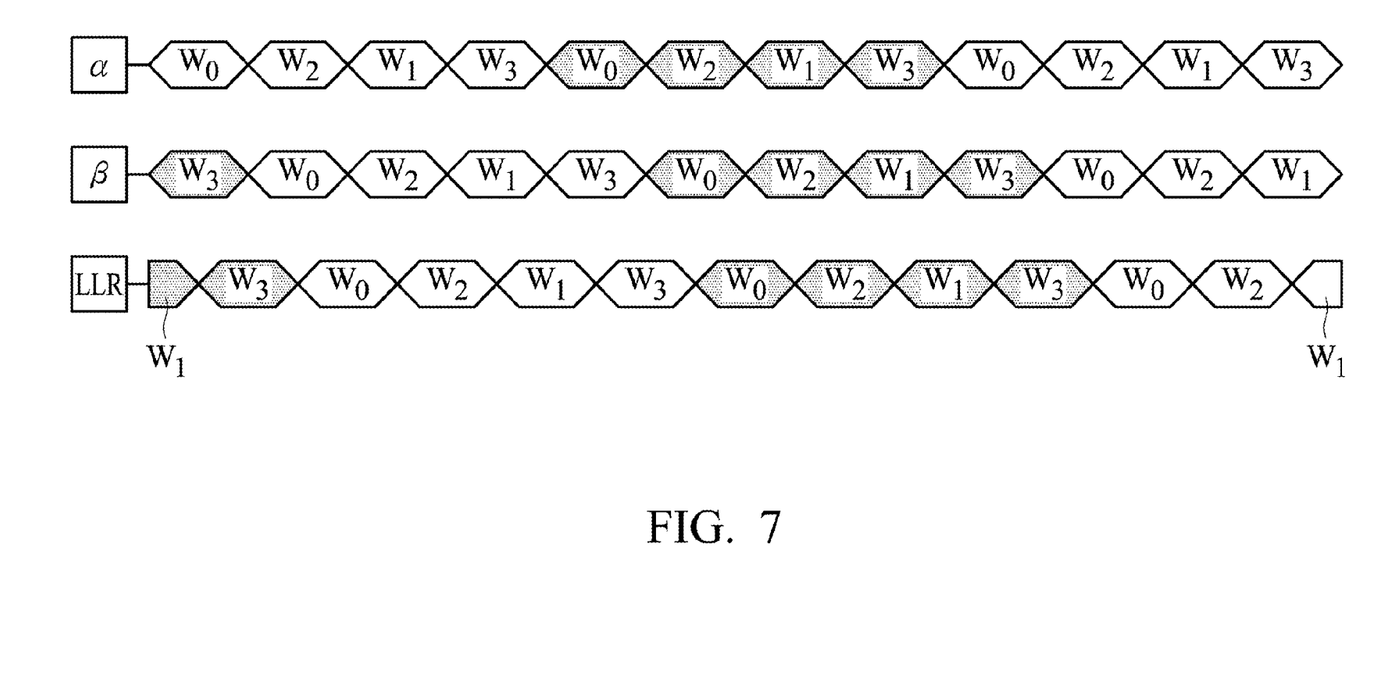
FIG. 7 is a timing diagram showing the active periods of the calculating units of the SISO decoder based on the decoding schedule shown in FIG. 6.

According to another aspect of the invention, to achieve 100% efficiency, the SISO decoder has to compute the LLR of last processed windows in a current half-iteration during the maximal overlapping period. Since $(\delta_a + \delta_b + \tau_a)$ is approximated to 2 L in the currently proposed modified SISO decoding schedule, the overlapping region involves the executions of two original-ordered windows and two permuted-ordered windows. Thus, the SISO decoder may deal with at least 4 windows simultaneously. FIG. 6 is a schematic diagram showing the decoding flow of the proposed SISO decoder, where the execution order is $W_0$, $W_2$, $W_1$, and $W_3$. After deriving the LLR of $W_0$ and $W_2$, the SISO decoder continues the unfinished process of deriving the soft value for $W_1$ and $W_3$. Meanwhile, the executions of $W_0$ and $W_2$ in the subsequent half-iterations begin immediately. FIG. 7 is a timing diagram showing the active periods of the calculating units of the proposed SISO decoder based on the decoding schedule shown in FIG. 6. As shown in FIG. 7, all calculation units, including the path metric calculation units for calculating the path metrics $\alpha$ and $\beta$ and the LLR calculation unit for calculating the LLR probability information, are fully utilized, and the operating efficiency $\eta$ grows rapidly from 66.7% to 100%. In other words, in the embodiments of the invention, the path metric and LLR calculation units may continuously function with nearly no idle period in successive half iterations as shown in FIG. 7, to achieving 100% efficiency.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An error correction code encoder, comprising:
   a first encoder, arranged to encode a plurality of input information bits to generate a plurality of first parity check bits;
   an interleaver, arranged to interleave the plurality of input information bits to generate a plurality of permuted information bits; and
   a second encoder, arranged to encode the plurality of permuted information bits to generate a plurality of second parity check bits,
   wherein the interleaver interleaves the plurality of input information bits in a window-wise manner so that the plurality of input information bits are divided into a plurality of input information bit windows before being interleaved, and a plurality of permuted information bit windows comprising the plurality of permuted information bits are generated thereafter, and
   wherein when the plurality of input information bit windows are grouped into a plurality of groups according to different window index characteristics, the window index of each permuted information bit window generated by the interleaver has the same characteristic as the corresponding input information bit window interleaved therefrom.

2. The error correction code encoder as claimed in claim 1, wherein the window index of each permuted information bit window is an even/odd number when the window index of the corresponding input information bit window interleaved therefrom is an even/odd number.

3. The error correction code encoder as claimed in claim 1, wherein the window index of each permuted information bit window is an even/odd number when the window index of the corresponding input information bit window interleaved therefrom is an odd/even number.

4. The error correction code encoder as claimed in claim 1, wherein the interleaver is a quadratic permutation polynomial (QPP) interleaver.

5. The error correction code encoder as claimed in claim 1, wherein the interleaver is an almost regular permutation (ARP) interleaver.

6. The error correction code encoder as claimed in claim 4, wherein the interleaver interleaves the plurality of input information bits based on the formula expressed as:
   where x is index of the plurality of input information bits, and $F(x)$ is index of the plurality of permuted information bits, and wherein a first parameter f1 and a second parameter f2 satisfy the following constraints:
   where L is window length, and L|f2 means f2 is divisible by L.

7. An interleaving/de-interleaving method performed by an interleaver/de-interleaver associated with a turbo code encoder, comprising:
   interleaving a plurality of input information bits to generating a plurality of permuted information bits,
   wherein the plurality of input information bits are interleaved in a window-wise manner so that the plurality of input information bits are divided into a plurality of input information bit windows before being interleaved, and a plurality of permuted information bit windows comprising the plurality of permuted information bits are generated after the interleaving step, and
   wherein when the plurality of input information bit windows are grouped into at least two groups according to different window index characteristics, the window index of each permuted information bit window has the same characteristics as the corresponding input information bit window interleaved therefrom.

8. The method as claimed in claim 7, wherein the window index of each permuted information bit window generated in the interleaving step is an even/odd number when the window index of the corresponding input information bit window interleaved therefrom is an even/odd number.

9. The method as claimed in claim 7, wherein the window index of each permuted information bit window generated in the interleaving step is an even/odd number when the window index of the corresponding input information bit window interleaved therefrom is an odd/even number.

10. The method as claimed in claim 7, wherein the plurality of input information bits are interleaved based on the formula expressed as:
   where x is index of the plurality of input information bits, and $F(x)$ is index of the plurality of permuted information bits, and wherein a first parameter f1 and a second parameter f2 satisfy the following constraints:
   where L is window length, and L|f2 means f2 is divisible by L.

* * * * *